United States Patent
Zhao et al.

(10) Patent No.: US 7,169,634 B2
(45) Date of Patent: Jan. 30, 2007

(54) DESIGN AND FABRICATION OF RUGGED FRED

(75) Inventors: Shanqi Zhao, Bend, OR (US);
Dumitru Sdrulla, Bend, OR (US)

(73) Assignee: Advanced Power Technology, Inc., Bend, OR (US)

( * ) Notice: Subject to any disclaimer, the term of this patent is extended or adjusted under 35 U.S.C. 154(b) by 0 days.

(21) Appl. No.: 10/757,028

(22) Filed: Jan. 13, 2004

(65) Prior Publication Data
US 2004/0164347 A1    Aug. 26, 2004

Related U.S. Application Data

(60) Provisional application No. 60/440,469, filed on Jan. 15, 2003.

(51) Int. Cl.
*H01L 33/00*    (2006.01)
(52) U.S. Cl. ............................ 438/91; 438/92; 438/167
(58) Field of Classification Search .................. 438/91, 438/92, 167
See application file for complete search history.

(56) References Cited

U.S. PATENT DOCUMENTS

| | | | |
|---|---|---|---|
| 3,909,119 A | 9/1975 | Wolley | |
| 4,140,560 A | 2/1979 | Rodov | |
| 4,895,810 A | 1/1990 | Meyer et al. | |
| 5,086,324 A * | 2/1992 | Hagino | 257/378 |
| 5,262,336 A | 11/1993 | Pike, Jr. et al. | |
| 6,054,748 A | 4/2000 | Tsukuda et al. | |
| 6,737,731 B1 * | 5/2004 | Shenoy | 257/656 |
| 2001/0017393 A1 | 8/2001 | Fujihira et al. | |

FOREIGN PATENT DOCUMENTS

| | | |
|---|---|---|
| EP | 0326187 A2 | 8/1989 |
| WO | 02/01643 A2 | 1/2002 |

OTHER PUBLICATIONS

Fairchild Semiconductor Data Sheets ISL9R860P2, ISL9R860S3S, 8A, 600V Stealth Diode, 6 pages, Apr. 2002.
Fairchild Semiconductor Data Sheets ISL9R30120G2, 30A, 1200V Stealth Diode, 6 pages, May 2002.
Fairchild Semiconductor Data Sheets ISL9R1560G2, ISL9R1560P2, ISL9R1560S2, ISL9R1560S3S, 15A, 600V Stealth Diode, 6 pages, Nov. 2002.

* cited by examiner

*Primary Examiner*—Long Pham
(74) *Attorney, Agent, or Firm*—Marger Johnson & McCollom, P.C.

(57) ABSTRACT

An improved Fast Recovery Diode comprises a main PN junction defining a central conduction region for conducting high current in a forward direction and a peripheral field spreading region surrounding the central conduction region for blocking high voltage in the reverse direction. The main PN junction has an avalanche voltage equal to or lower than an avalanche voltage of the peripheral field spreading region so substantially the entire said main PN junction participates in avalanche conduction. This rugged FRED structure can also be formed in MOSFETS, IGBTS and the like.

15 Claims, 7 Drawing Sheets

DESIGN AND FABRICATION OF RUGGED FRED

RELATED APPLICATION DATA

This application claims priority from U.S. provisional application Ser. No. 60/440,469 filed Jan. 15, 2003.

FIELD OF INVENTION

The present invention relates to power semiconductor devices and more particularly to power diodes with extremely high ruggedness.

BACKGROUND OF THE INVENTION

Diodes are semiconductor devices made of two oppositely doped semiconductor layers which are characterized by the ability to block high voltage in the reverse direction with very low leakage current and carry high current in the forward direction with low forward voltage drop. They are therefore unidirectional switches which allow signal and power to pass in one direction but not the other. They are widely used in power electronic circuits to provide the functions for freewheeling, rectification, and snubbing in converters, inverters, motor controls, switch mode power suppliers, power factor correction, inductive heating, welding, uninterruptible power supplies and many other power conversion applications.

These power diodes, including one subgroup referred to as FREDs (Fast Recovery Epitaxial Diodes) and another subgroup using bulk semiconductor material, usually consist of an active area and a peripheral edge region. The active area in the center of the semiconductor device carries high current in the forward conduction and blocks high voltage in the reverse direction with low leakage. The peripheral edge region must also block the same high reverse voltage with equally low reverse leakage current through the use of guard-rings, bevels, grooves and other surface field spreading structures to support the high voltage in reverse blocking. For purposes of illustration, the drawings and ensuing discussions focus primarily on the FREDs. However, the inventive principles apply equally to all types of diodes as well as devices possessing diode-like structures as part of the device construction.

In modern power conversion applications, these diodes are used in conjunction with other high current, high voltage semiconductor devices such as high frequency Insulated Gate Bipolar Transistors (IGBTs) and power MOSFETs. In such high frequency and high power applications, particularly in power electronic circuits with inductive loads, the power diodes are required not only to have high breakdown voltage and high current capability but also to have high ruggedness.

FIG. 9 shows a common boost circuit where a fast recovery diode can be used. The lower input voltage V1 is converted to a higher output voltage V2 to drive a load. V1 is represented here as a DC voltage. In extended applications, it can be a rectified voltage off the AC line. As shown, the circuit uses a single power switch Q and a single diode D. L and C are an inductor and a capacitor. When the power switch is conducting, it stores energy in the inductor. When it is turned off, the stored energy is diverted into charging the capacitor C. The value of V2 is dependent on the switching frequency, the duty ratio and the resistance and capacitance in the circuit. The maximum voltage applied across the diode D is about the difference between the output voltage V2 (neglecting diode forward voltage drop) and voltage drop across the power switch. When the diode is not rugged, this voltage is kept below 60–70% of the diode rated voltage so that noise and spikes inherent in the environment will not accidentally spike above the diode avalanche voltage, causing it to fail. This imposes an undesirable guard-band condition. If rugged diodes are available, one can either raise the output operating voltage or use a diode with a lower blocking voltage in the same circuit. In the latter case, a lower voltage will have associated with it a lower forward voltage drop, therefore, lower conduction loss, and furthermore a lower recovery loss. The circuit layout will generally not change when a rugged diode is used. The main difference is in improved circuit reliability and efficiency.

The above-mentioned ruggedness is usually measured by its Unclamped Inductive Switching (UIS) capability, i.e. the ability of the device to go into avalanche and dissipate all the energy stored in the inductive load without suffering any damage. For conventional diodes (including FREDs) which are most popular and available in the present market, it is easy to get high voltage and high current ratings, e.g. 1200V/200 A, but it has not heretofore been possible to get high UIS capability. The highest UIS capability rating we can find so far in the market is 20 mJ at 1 A for Stealth Diodes (Trade Mark of Fairchild Semiconductors) rated at forward currents of 8 A and 15 A with 600V reverse blocking voltage and 30 A with 1200V reverse blocking voltage. (See referenced Product Data Sheets for these devices from Fairchild Semiconductors). Such low UIS energy capability is hardly adequate to prevent the diodes from being damaged in the presence of voltage spikes, let alone to protect other devices in such circuits. Therefore, to have high UIS capability for diode products is an important objective.

The ensuing discussions and illustrations are given for a P+N diode structure. It is obvious that the specific ideas of the invention apply equally well to an N+P diode if the polarities of the appropriate dopants are reversed.

Conventional diodes are made by introducing typically a P-type dopant such as boron, gallium, or aluminum into an N-type semiconductor substrate and diffuse it to an appropriate depth to create a PN junction. This P-dopant forms the central active area of the device for forward conduction. The substrate doping level and thickness of the N-type region are adjusted so as to obtain the desired blocking voltage and the desired forward voltage since the product of forward current and forward voltage measures power loss by the diode as it controls electric power. At the periphery, different voltage spreading and electric field reduction techniques are commonly used to withstand the reverse blocking voltage. The P-type doping level and junction depth are varied dependent upon the desired blocking voltage and the voltage blocking scheme used. In general, sufficient P dopant is introduced so that, up to the avalanche voltage, there remains substantial P-dopant to prevent "reach-through" conduction to the electrode connected to the P region. Design of the P-dopant profile can be made by considering charge balance on the P side and the N side of a PN junction under the designed reverse voltage. For example, it is generally sufficient to block 1200V with a P-diffusion of about 5 to 8 μms (microns) employing multiple plane guard-rings and field plates at the device periphery with a surface doping concentration anywhere from 1.0E16/cm3 to 1.0E19/cm3. For a 5000V diode, the same general guidelines for substrate doping and the amount of P-dopant still apply. It usually takes a deeper P-diffusion depth, anywhere from 30 to 90 μms, to provide sufficient P-type charge for such high voltage. Furthermore, it requires the use of single or double beveling to reduce electric field at the device periphery to sustain the desired blocking condition.

Prior art conventional devices have low ruggedness because the avalanche conditions of these devices occur in a limited area at the periphery of the active P–N junction, as shown in FIG. 1(a). Because avalanche occurs in a limited area, and avalanche current is confined to the limited area, the ability of the device to dissipate energy under the avalanche condition without causing damage to the device is also limited.

SUMMARY OF THE INVENTION

The present invention provides a diode structure and fabrication method for achieving high ruggedness by creating an avalanche condition in a much larger portion of the active area of the device, which can be either a substantial portion of the active area or the entire active area of the device, and not just at the device periphery. The larger the participating area for avalanche, the higher the avalanche ruggedness or capability. The device active area is typically the largest feature in the device in order to conduct the high forward current while maintaining an acceptable forward voltage. It is, therefore, this same area we want to use to conduct the avalanche current in the reverse direction, as shown in FIG. 1(b). In order to make the entire active area avalanche simultaneously, various methods can be devised. One can increase the breakdown voltage of the periphery thereby accentuating the center portion to cause a lower avalanche voltage within the active area of the device. Or one can keep the periphery unaltered and reduce the avalanche capability of the center active area. Either way, the same large area used for forward conduction is also used for dissipating energy in avalanche.

Other objects, features and advantages of the invention will become more apparent from the following detailed description, which proceeds with reference to the drawings.

DESCRIPTION OF THE INVENTION

Preferred Structure

Figure 1A:
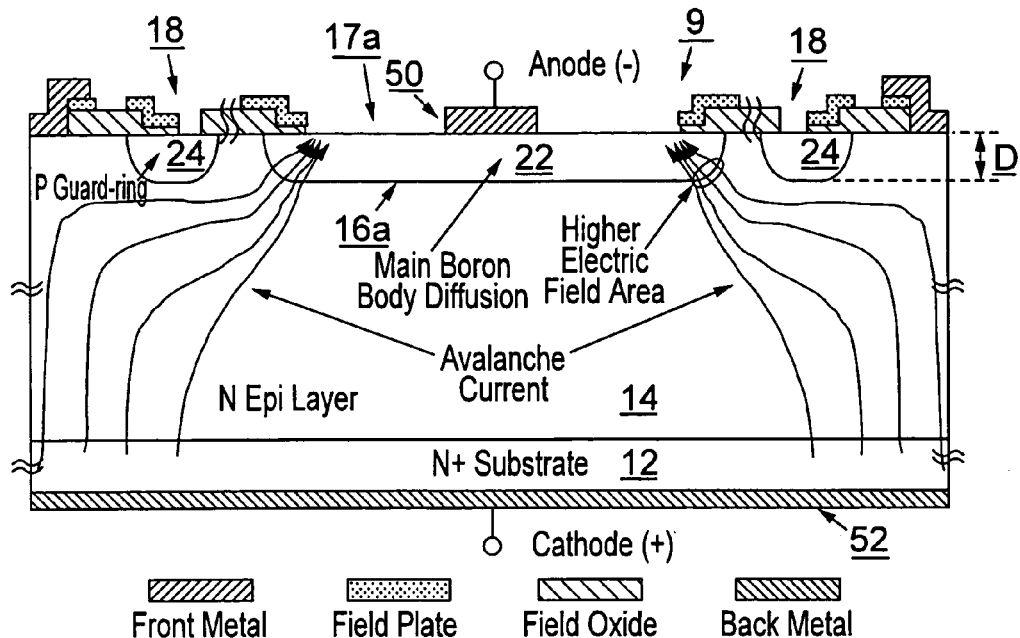
FIG. 1(a) is a cross-sectional view of a conventional fast recovery diode (FRED) showing a principal PN junction in the center area and peripheral guard-ring PN junctions extending symmetrically from the center area toward the edge of the device. Avalanche current flow is shown by arrows as taking place at the periphery of the main PN junction.
Figure 1B:
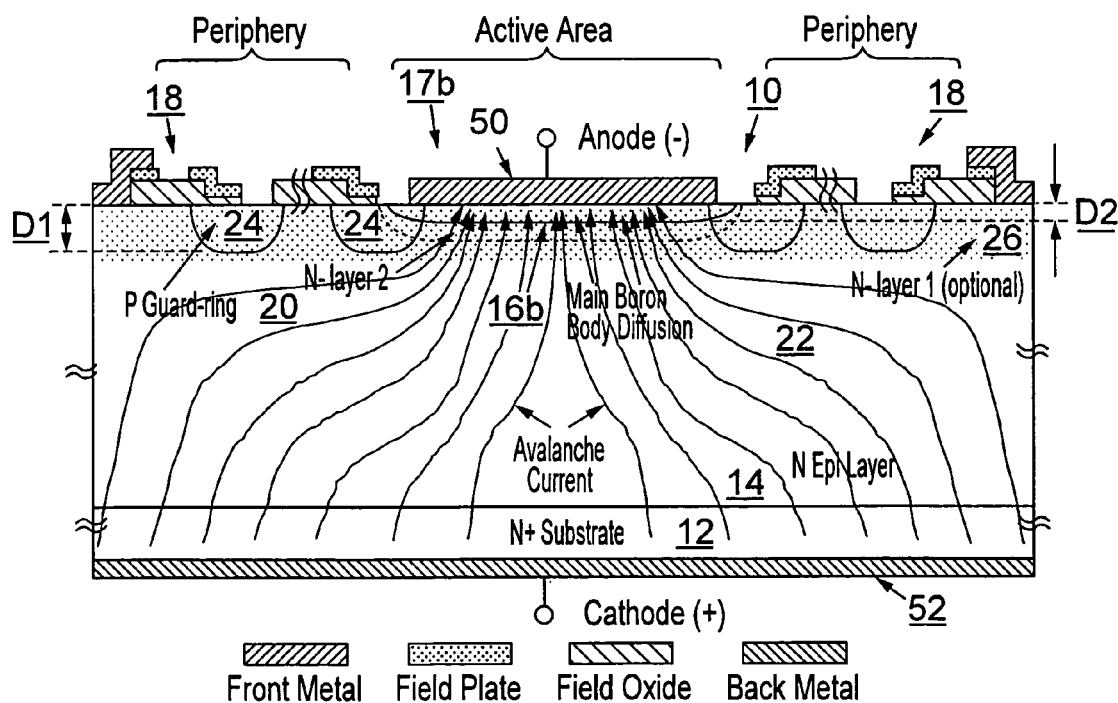
FIG. 1(b) is a cross-sectional view of a FRED according to the present invention. The structure shown is similar to FIG. 1(a) for the edge protective guard-rings. However, the entire central portion of the principal PN junction participates in avalanche, as shown by arrows.

FIG. 1 shows the cross-sectional views of a rugged FRED 10 (FIG. 1(b)) and a conventional FRED 9 (FIG. 1(a)) for comparison. They both have the same starting material of an N-type epitaxial layer 14 on N+ substrate 12, the basic structure of a PN junction 16a, 16b in the active area 17a, 17b and plural guard-ring structure 18 at the device periphery. In the conventional FRED 9, the P-diffusion depth D is generally the same for the active area and for the guard-ring area. In the rugged FRED 10, the structure of the rugged FRED shown in FIG. 1(b) has a second N-layer 20 (dashed line), a shallow P-diffusion layer 22 forming junction 16b in the second N-layer 20 in the active area 17b, and a comparatively deeper P-diffusion layer 24 in the guard-ring area. Depth arrow D1 indicates the depth of the PN junction in the guard-ring and arrow D2 indicates the lesser depth of the PN junction in the active area. The fact that the guard-ring PN junction is shown to be deeper is a matter of design choice and not a necessary component of the invention because shallow guard-ring diffusion when properly designed can still have a higher avalanche breakdown voltage than the active area.

An optional N-layer 26 is shown diffused into the substrate from the top surface. This layer is labeled N-layer 1 to be consistent with the process sequence in FIG. 5. The purpose of this N-layer 1 is to prevent current flow along the surface between the active area and the edge of the device due to "counter doping" of the lightly doped N-type epitaxial layer by a life-time control dopant, usually a transition metal such as gold or platinum used to increase the speed of the FRED. Counterdoping can be of particular concern for high voltage diodes which start with a very lightly doped N-type epitaxial layer. Heavy metal life-time control dopant when activated contributes a level of P-type dopant between 1.0E13/cm3 to 5.0E15/cm3 (depending on the temperature for introducing the life-time control dopant) at the surface and can cause the lightly doped N-type material to reduce its effective doping level or to be converted to P-type, thereby causing a conduction path across the surface. By using a higher doping N-layer 1 at the surface, the adverse counter-doping effect is rendered harmless.

The purpose of the N-layer 2 (diffusion 20) and shallow P diffusion 22 is to force avalanche breakdown to take place in the central portion of the device in the entire active area instead of just in the periphery. Since the entire active region has a much large area than the periphery of the main PN junction of the device, high avalanche energy capability is achieved by forcing avalanche breakdown to occur in this region.

Figure 5:
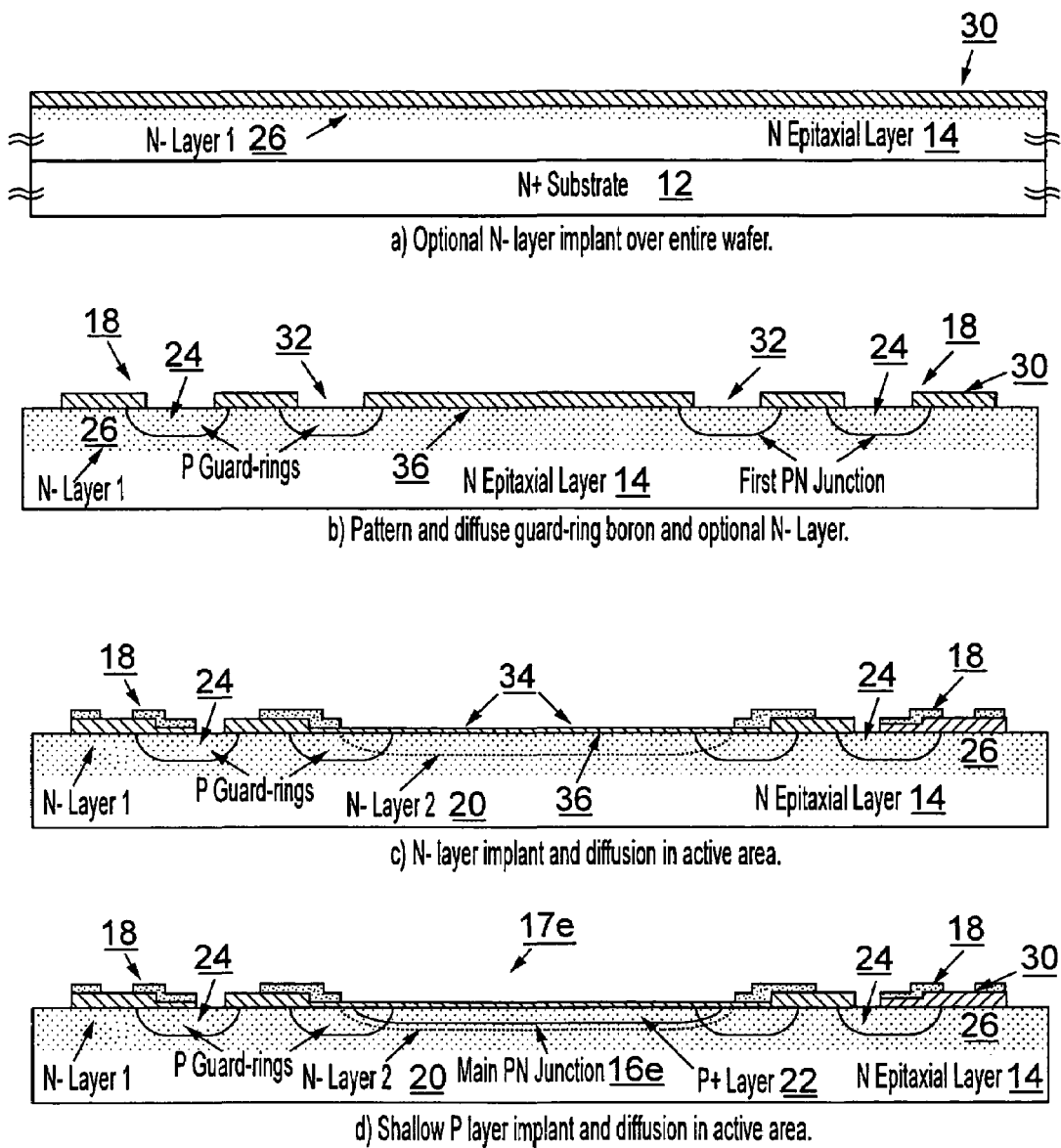
FIG. 5a)–d) is a series of cross-sectional views showing the key processing steps for making a rugged FRED as shown in FIG. 1(b) according to the principle illustrated in FIG. 4.

FIG. 5 shows the key process steps of a rugged FRED embodying the principle illustrated in FIG. 1(b). The fabrication process has one additional mask compared to the conventional FRED but can use the same silicon substrate 12, 14. Prior to field oxidation in FIG. 5(a), the optional N-layer 1 (diffusion 26) is introduced such as by a blanket ion implantation into the upper semiconductor surface in a dose of 5.0E10/cm2 to 5.0E12/cm2 at an energy of 30–100 KeV. This dopant will be diffused into the substrate in subsequent thermal processes to a depth preferably slightly deeper than the guard-ring P-diffusion.

Windows 32 are opened in the field oxide 30, as shown in FIG. 5(b), to allow the introduction of P-dopant 24 into the guard-ring region 18 at the periphery of the device. This is usually done by implanting boron in a dose between 1E12/cm2 to 1E5/cm2 in an energy range between 40–120 KeV. The guard-ring P-dopant may be diffused to form PN junctions right after the implantation step or in conjunction with other dopants for the P and N diffusions in the active region at a later time.

The main active area window 34 is opened next as shown in FIG. 5(c), and the N-layer 2 is implanted in a dose between 5E11/cm2 to 5E14/cm2 at an energy of 30–100 KeV and diffused into the substrate in the active region defined by window 34 to raise the N-type dopant level in the vicinity of the top surface 36.

A PN junction 16e in the main body of the active area 17e is formed in FIG. 5(d) by implanting boron at a dose of 1E12/cm2 to 1E15/cm2 with an energy between 40–120 KeV and diffused into the N-layer 2. Doses higher than indicated can be used but devices will have higher implantation damage and higher leakage current. Therefore, high dose should be avoided.

The proper combination of doses for N Layer 2 (diffusion 20) and P boron body (diffusion 22) depends on many factors. The objective is to create an additional N charge which in turn modifies the electric field so that avalanche breakdown voltage is purposely reduced in the main body of the PN junction 16e compared to regions without N+ layer 2, such as in the guard-rings. It should be understood by those skilled in the art that many dose combinations are possible to accomplish the objective depending on the relative depths of the N and P diffusions 20, 22 and the desired injection level. In a P+N junction, the injection level is controlled principally by the dose of the P+ side. The P-dopant controls the amount of excess minority carriers injected over the PN barrier into the N side during forward conduction and requires a commensurate amount of life-time control dopants to recombine in reverse recovery. Thus, for a desired recovery speed/characteristic, the higher the P-dopant level drives a proportionately higher dose of life-time control dopant. This life-time control dopant further impacts the counter-doping effect and the resultant net N charge on the N-side.

Figure 4:
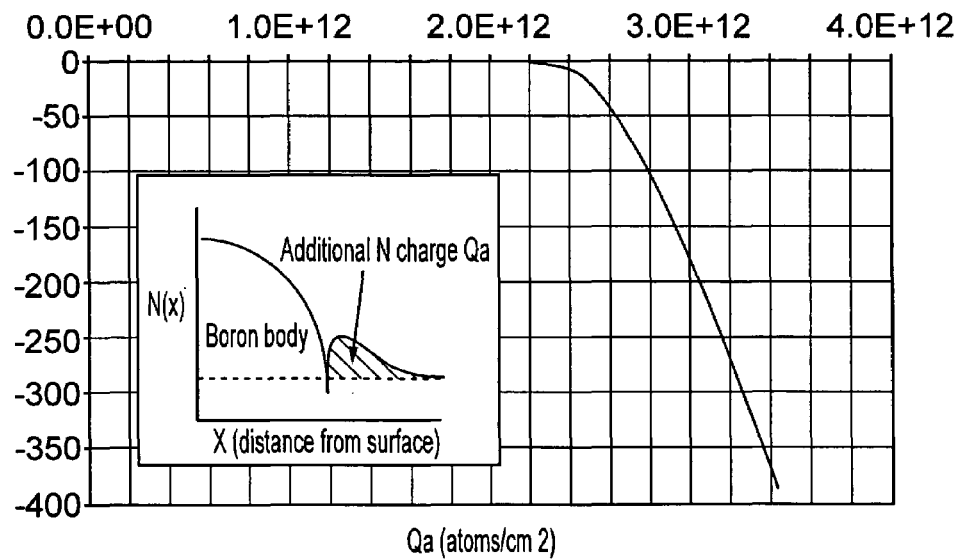
FIG. 4 is a graph of the relationship between breakdown voltage reduction and additional N charge for one embodiment of a rugged FRED according to the present invention.

The above description of creating a higher electric field and lower breakdown voltage in the active main body area of the device by introducing an additional higher N dopant layer underneath the P diffusion to form a P–N–N⁻ junction has the capability of the largest avalanche area on a device. The amount of additional charge generated by the higher N dopants is crucial to this concept in depressing the breakdown voltage. FIG. 4 shows the relationship between breakdown voltage reduction and the additional charge in the N region. The experimental data of breakdown voltage shown in this drawing is for a life-time control process of a 5 second ~1015° C. RTA (rapid thermal anneal) life-time control dopant diffusion (or equivalently a 6 hour furnace diffusion at ~910° C.). A higher life-time control process (e.g., more Pt or Au diffused in the N epitaxial layer) will shift the curve to the right in order to achieve the same breakdown voltage reduction. Obviously, the breakdown voltage decreases as additional charge is added. The introduction of additional N-type charge to reduce the breakdown voltage in the active area can also take place from the backside of the epitaxial layer such as by creating a buried N-layer in the epitaxial layer. However, this is not as convenient or cost effective as the approach described and shown in FIGS. 1(b), 4 and 5.

ALTERNATIVE METHODS FOR THE INVENTION

Figure 2A:
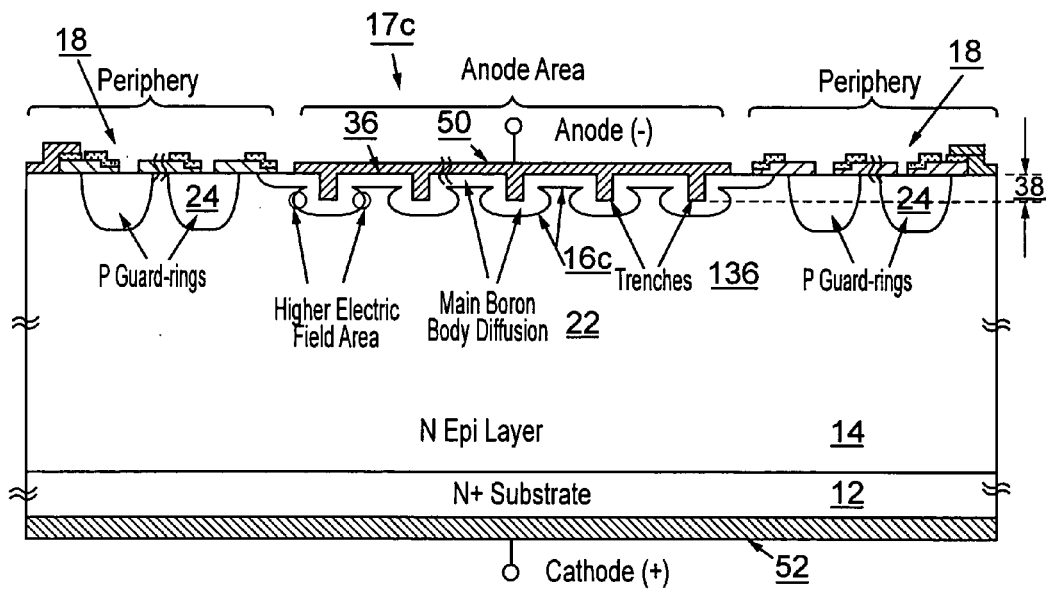
FIG. 2(a) is a cross-sectional view of an alternative structure for a rugged FRED according to the invention showing the use of trenches followed with P-dopant introduction and diffusion to create acute curvature in the active central area of the device.
Figure 2B:
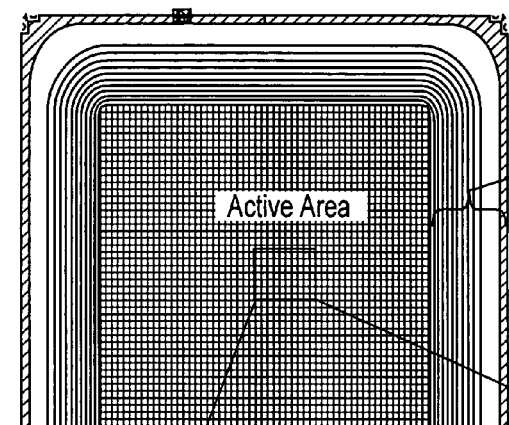
FIG. 2(b) is a top view of one representative trench pattern for which FIG. 2(a) can be the cross-sectional view along lines A–A'.
Figure 2B:
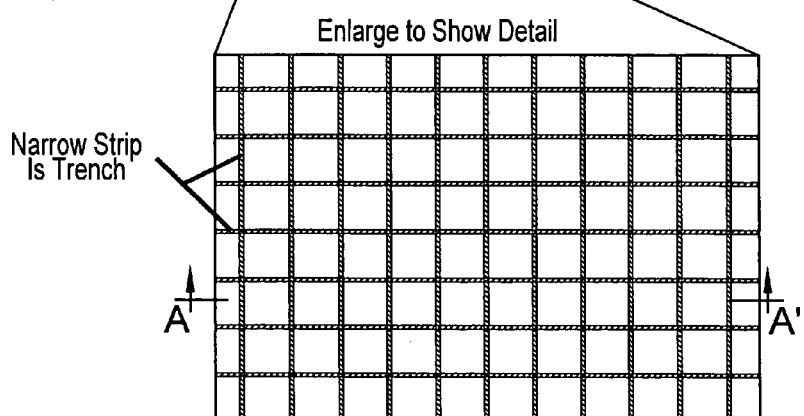

Following are several alternative approaches to making rugged FREDs according to the basic principles of the present invention:

1) FIGS. 2(a) and 2(b) show the alternative approach of creating trenches 136 in a matrix (or array) structure in the active area 17c. These trenches can be interlacing stripes in the X and Y direction or arrays of circles, squares or the like wherein a height difference is first created in the top surface. The grid structure is intended to maximize the number of similar acute curvature regions thereby increasing the avalanche area and UIS capability. Spacing between trenches is adjusted in relationship to the diffusion depth so as to create the largest avalanche area possible. For shallow junction depths, the spacing can be narrow so that more trenches can be packed per unit area. Other trench patterns such as small circular trenches spaced apart and arrayed in square, rectangular or hexagonal symmetry over the active area can also be used. However, these have the disadvantage of having a smaller avalanche area and, therefore, lower UIS capability as compared to the case of FIG. 2(b).

After forming the trench array, P-dopant 22 is next introduced at both the untrenched top surface and at the bottom of the trenches. After diffusing the P-dopant to merge with the P-dopant along the sidewalls, an acute curvature is created at corners or edges of the trenches. The trench depth 38 in this construction is no deeper than about twice the active area P-diffusion depth. For example, trench depth 38 can be 2 microns and diffusion depth about 1.5 micron. In one embodiment, the diffusion has a depth that is greater than one half the trench depth to form a PN diode wherein the P-diffusions originating at two height levels spaced apart by the depth of the trench are linked. In another embodiment, the diffusion has a depth which is shallower than one half the trench depth to create a merged Schottky-PIN structure.

The P-diffusions around the bottom corners of the trenches form areas of acute curvature having high electric field which initiates the avalanche so that the breakdown voltage in the active area 17c becomes depressed as depicted in FIG. 2(a). However, this structure can only induce avalanche in an area smaller than the entire active portion of the active device area thereby achieving an avalanche capability less than the optimal.

Figure 3:
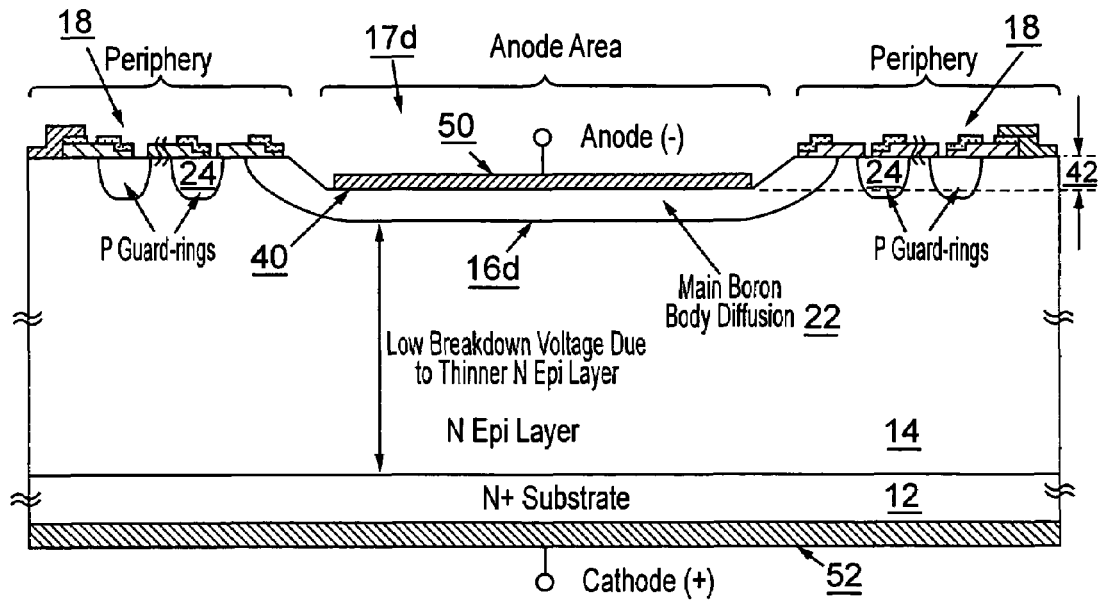
FIG. 3 is a cross-sectional view of yet another alternative structure for a rugged FRED according to the present invention wherein the center part of the semiconductor material is thinned down so as to force a lower breakdown voltage in the thinned region.

2) Another alternative is creating substantially thinner N-type epitaxial layer in the active area than the periphery by reducing the epi thickness of the active area relative to its periphery, as shown in FIG. 3. Due to a thinner epitaxial layer remaining in the active area, a lower breakdown voltage in the center of the device than the periphery is induced. This task can be accomplished by chemically dry or wet etching a depression 40 of depth 42 in the N-type epitaxial layer in the active area 17d. The residual thickness of the epitaxial layer 14 in the active area is 85% or less than that of the periphery. This etching is done while protecting the peripheral guard-ring area with a mask. The thinner epitaxial material causes a lower breakdown voltage to occur in the active area 17d of the device effecting a breakdown voltage "clamping" by the active area.

3) Another approach is improving the peripheral field spreading scheme to above the limit of "plane junction" breakdown. This can be accomplished through positive beveling, multiple deep trenches, larger radius of curvature diffusions or grooves in the peripheral on the top surface or on both surfaces of the wafer at the device periphery to increase the breakdown voltage of the peripheral region of the device thereby forcing the active region to avalanche first. In general, these methods require much more complex processing steps and larger real estate; therefore, more cost.

As implied in the above discussion, life-time control is necessary in general to control the device reverse recovery speed and recovery charge for all the methods discussed above. Prior U.S. Pat. Nos. 5,262,336 and 5,283,202, incorporated herein by reference, describe methods for improving life-time control without substantially increasing leakage current that are applicable as effective life-control methods for the present invention. It must be emphasized that the additional N dopant layer, the shallow P-diffusion and associated charges as described in the embodiment of FIG. 1(b) above must be designed in consideration of the life-time control method used because most life-time control measures tend to modify the dopant level by compensating or counter-doping the doping level of the host material. Irradiation has the least counter-doping effect and forward voltage drop while heavy metal has the most counter-doping impact. However, Pt has been proven to have by far the lowest leakage current at elevated temperatures. Irradiation, although generally having low leakage current at room temperature, has a larger increased leakage current compared to Pt dramatically at >100° C. Heavy metal doping life-time control and irradiation may be combined to effect life-time control. However, one must bear in mind the attendant adverse leakage current associated with irradiation at higher temperatures.

Completion of the device follows normal procedure to protect the device with conducting metal electrodes 50, 52 on the frontside and backside of the semiconductor and to provide protective insulating layer at the device surface.

The embodiments mentioned above illustrates various methods to accomplish the desired objective of achieving large area avalanche. Other methods are readily apparent to those skilled in the art without deviating from the spirit of the present invention. However, the most straight-forward method is the preferred structure. The following further summarizes how this can be achieved without altering the guard-ring design:

a) Start from an N-type substrate with appropriate background doping level for the desired blocking voltage as in prior art devices.

b) Provide the standard voltage blocking structure at the periphery of the device the same as in prior art devices. Block the active area for future processing and introduce and diffuse the first P-type dopant into the device periphery to form the first PN junctions for the periphery of the device.

c) Introduce a second N-type dopant into the entirety or large portion of the active area and diffuse to create an N-type dopant profile substantially higher than that of the background doping level.

d) Introduce a second P-type dopant into the active area and diffuse it into the higher doped second N-type layer to create a second PN junction, which has an avalanche breakdown voltage below that of the peripheral PN diode due to a higher electric field near this shallower second PN junction.

e) Apply means for life-time control to effect the desired switching speed and recovery charge.

f) Provide conductors for top and bottom electrodes and protective film against mechanical handling to complete the device.

This new FRED structure just described has a second PN junction in the active area of the device. It has a depth shallower than that of the peripheral diode. For example, the second N-type dopant has a surface concentration in the range of 1.0E15–5.0E17/cm3 and a diffusion depth of 3 to 10 urns with a companion second shallow P body layer having a diffusion depth of about 2–6 µms and a surface concentration of 1.0E16 to 5.0E18/cm3 while the periphery PN junction can be 8 ums deep with a surface concentration of 1.0E18 to 1.0E19/cm3. Again, this difference in junction depths between the main body area and the guard-ring is preferred but not necessary.

It should be pointed out that although the foregoing discussion focuses on the simplest PN junction diode for convenience. The principles described apply equally well to other types of semiconductor devices having PN junctions as integral part of the device construction. For example, MOSFET and IGBT as described in, e.g. U.S. Pat. Nos. 4,895,810 and 5,262,336 and the like teach forming PN junctions between the P-body diffusion and the N-type substrate. The inventive concept described so far can be applied to these and other types of devices as well. It should also be pointed out that the exemplary methods may be applied singly or in combination to effect large area avalanche breakdown. For example, the concept of introducing additional N charge as taught in FIGS. 4 and 5 in the preferred embodiment and the preferred embodiment in combination with the alternative method (1) of using trenches followed with implantation and diffusion have both been applied successfully to the PN structure of IGBT and MOSFET devices to produce substantially improved UIS capability through inducing avalanche breakdown simultaneous in identical structures in the device active area.

Figure 8A:
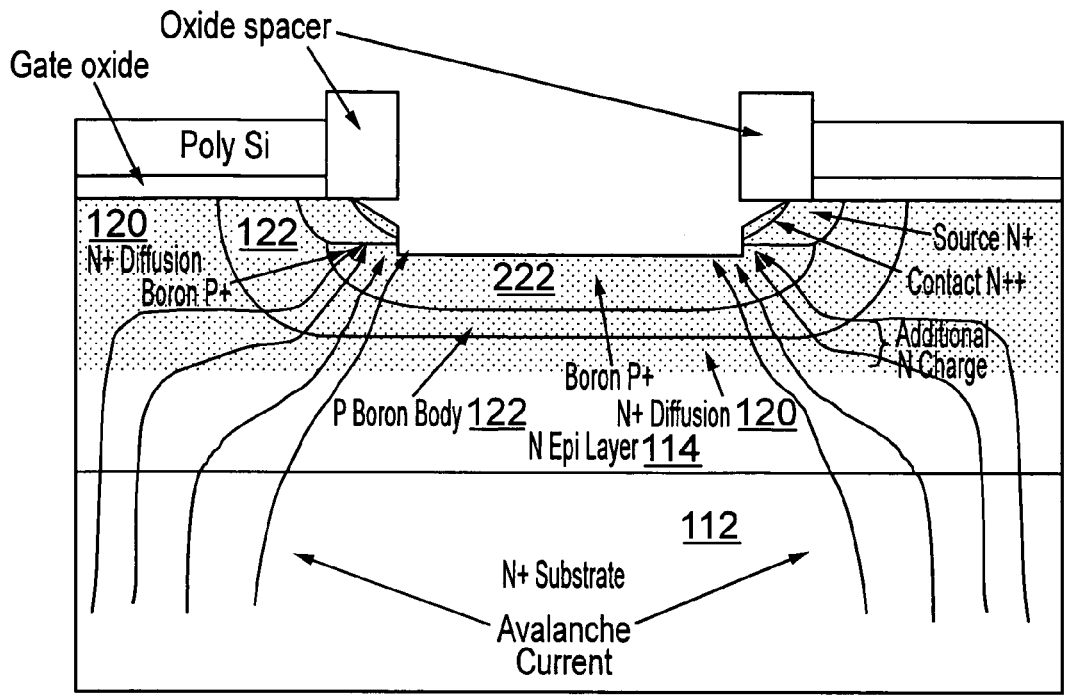
FIG. 8(a) is a cross-sectional view which shows application of the concept of FIG. 4 to a MOSFET device wherein the P+N junction is formed between the P-body diffusion and an N-diffusion layer.
Figure 8B:
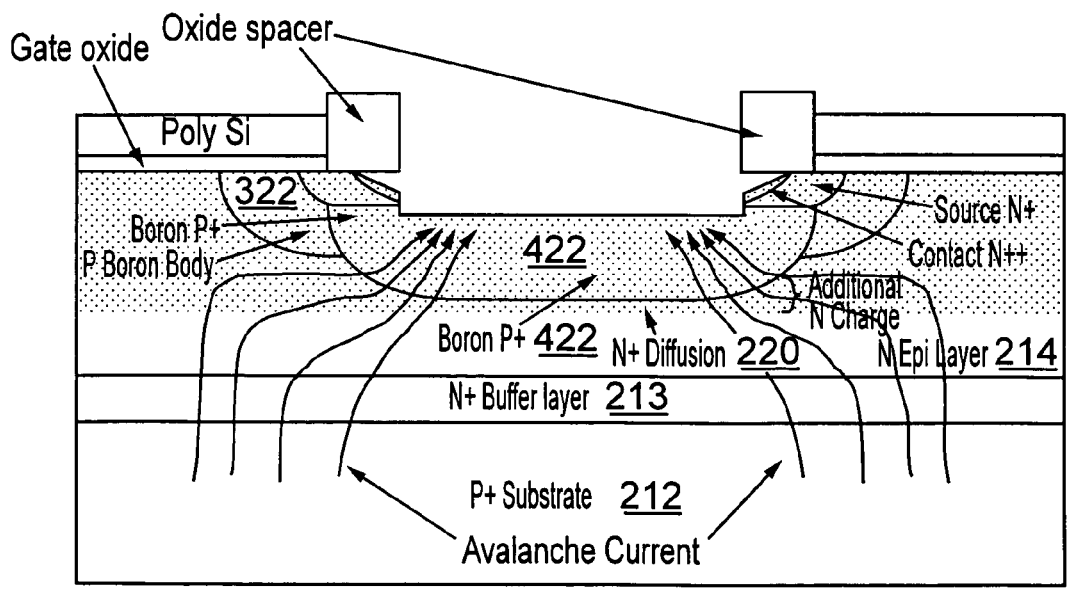
FIG. 8(b) shows application of the concept of FIG. 4 to an IGBT device wherein the P+N junction is formed between the deep P+ diffusion at the bottom of the trench and an N-diffusion layer.

FIGS. 8(a) and 8(b) depict examples of such incorporation involving different PN diffusion structures associated with one representative trench of a '810 and '336 type device. The figures are each drawn for a representative structure centered around a trenched region. The actual device is made up of a large number of similar structures contiguously arranged to form the entire device. When large numbers of like structure are made to avalanche through the combination of additional N charge, trench, implant and diffusion, the UIS capability of the device to withstand high energy under avalanche is increased. To emphasize the equivalence in structures between a simple PN diode and the more complex MOSFET or IGBT structures of FIGS. 8(a) and 8(b), the numerical identifiers 120 and 220 are used to refer to structures equivalent to 20 for the additional N-dopant layer. Similarly 122, 222, 322 and 422 are identifiers for various P-type diffusions equivalent to the P-diffusion 22 in the simpler PN diode.

IGBT devices can be made to avalanche at the same locations as the MOSFET shown in FIG. 8(a). However, the strongest UIS capability is the one illustrated here in FIG. 8(b) in that the avalanche current has the shortest path to the cathode conductor, avoiding turning on any parasitic structure (a MOSFET has a parasitic NPN bipolar structure while an IGBT has a parasitic NPNP thyristor). It follows naturally that the concept shown in FIG. 8(b) is applicable also to a MOSFET. In our prior U.S. Pat. Nos. 4,895,810 and 5,262,336, incorporated by this reference, we described how to form the enhanced P+ region in the trench. To lower the avalanche voltage in an IGBT, the prior art technique of forming deep P+ diffusion is combined with the procedure for introducing N+ layer 2, as described above and shown in FIG. 5(c), at an earlier stage of fabrication such as before gate oxidation.

Figure 6:
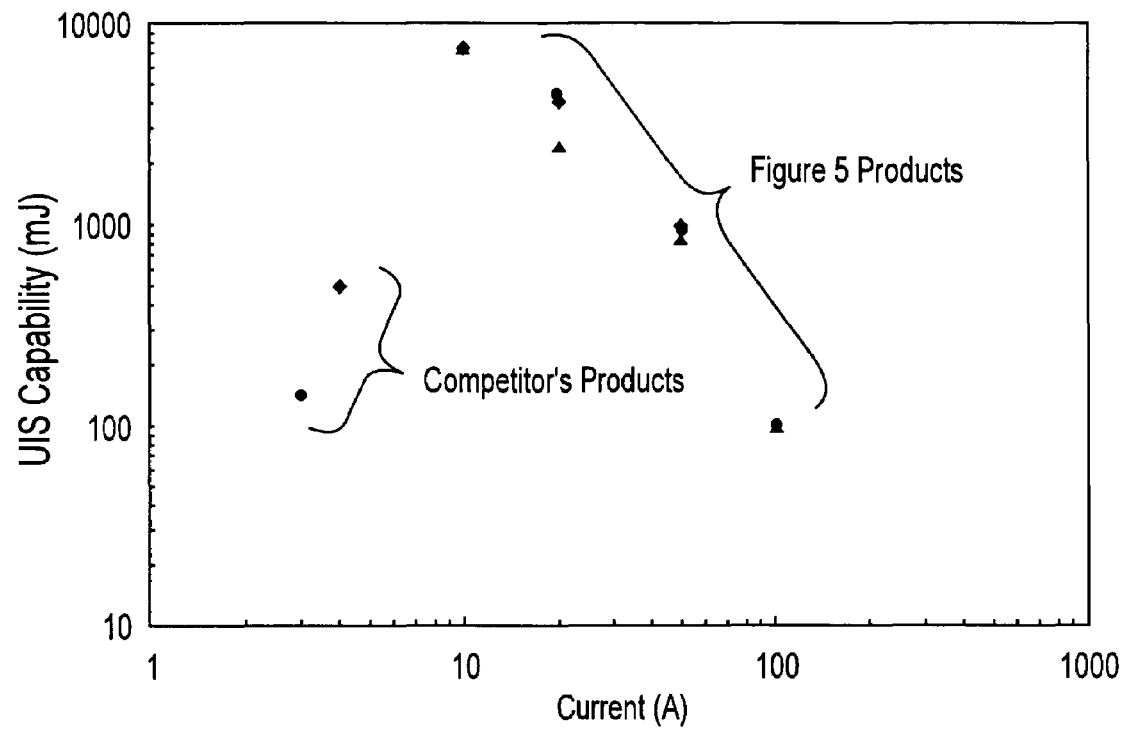
FIG. 6 is a plot of UIS capability versus avalanche current comparing FRED devices of FIGS. 4 and 5 with prior art devices.
Figure 9:
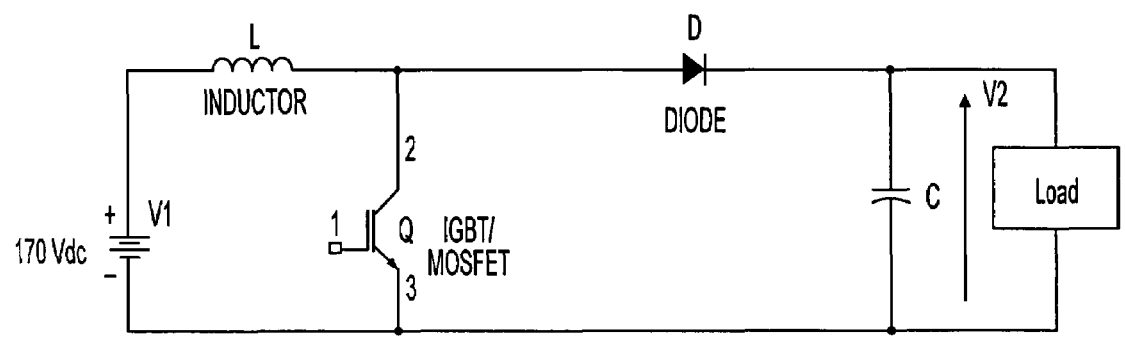
FIG. 9 shows a simple boost circuit as an example of a circuit which utilizes a fast recovery diode.
Figure 7:
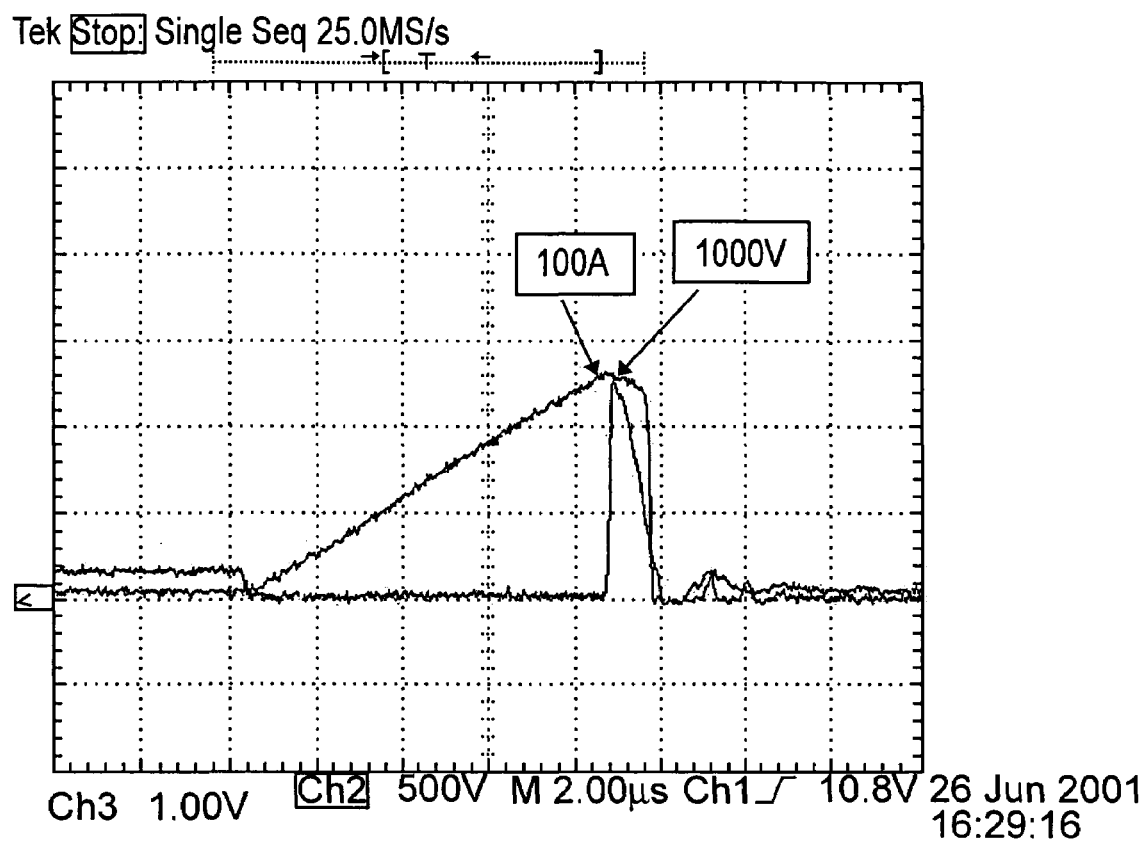
FIG. 7 is a graph of UIS capability test waveform for a rugged FRED made according to the process of FIG. 5.

EXPERIMENTAL DATA OF THIS INVENTION 1000V, 100 A FREDs have been produced by using the preferred structure and method as described above and shown in FIGS. 1(b) and 5. FIG. 6 shows the UIS capability versus avalanche current of representative devices, and FIG. 7 shows a representative companion UIS test waveform. It is clear that this new structure and concept has produced unprecedented UIS capability.

While specific exemplary embodiments of the present invention have been shown, they are in no measure intended to be exhaustive but only serve to illustrate the inventive concept. It will be obvious to those skilled in the art that many variations and modifications will immediately become apparent. We claim all such variations and modifications as fallen within the scope of this invention.

The invention claimed is:

1. A fabrication process for making an enhanced avalanche ruggedness Fast Recovery Diode, the process comprising:
   selecting a semiconductor material of a first dopant type;
   patterning and introducing a first dopant of a second type opposite in polarity to the first dopant type into the top surface of the semiconductor material at a peripheral region of the device;
   diffusing said first dopant to create field spreading structures for blocking reverse voltage;
   introducing a second dopant of the first type into a central portion of the semiconductor material top surface;
   diffusing said second dopant to create a region with enhanced doping concentration of the first type within the semiconductor material in the central portion of the device;
   introducing and diffusing a third dopant of the second type to a predetermined depth within said enhanced doping region to form a main PN junction and effect a lower avalanche breakdown in the central portion in relationship to a periphery of the main PN junction; and
   forming metal electrodes on the top surface and a backside of the semiconductor material to conduct current through the diode;
   further comprising a blanket implant of the first dopant type into the semiconductor surface to counter the effect of counter-doping and compensation by a life-time control dopant.

2. A fabrication process for making an enhanced avalanche ruggedness Fast Recovery Diode, the process comprising:
   selecting a semiconductor material of a first dopant type;
   patterning and introducing a first dopant of a second type opposite in polarity to the first dopant type into the top surface of the semiconductor material at a peripheral region of the device;
   diffusing said first dopant to create field spreading structures for blocking reverse voltage;
   introducing a second dopant of the first type into a central portion of the semiconductor material top surface;
   diffusing said second dopant to create a region with enhanced doping concentration of the first type within the semiconductor material in the central portion of the device;
   introducing and diffusing a third dopant of the second type to a predetermined depth within said enhanced doping region to form a main PN junction and effect a lower avalanche breakdown in the central portion in relationship to a periphery of the main PN junction; and
   forming metal electrodes on the top surface and a backside of the semiconductor material to conduct current through the diode;
   further comprising a first deep life-time control dopant profile having a gradient that is higher in doping concentration toward the backside of the semiconductor; and
   a second shallow life-time control profile having a gradient that is heavier toward the top surface forming a shallow gradient band of decreasing concentration near the PN junction.

3. The fabrication process according to claim 1 further comprising a first deep life-time control dopant profile having a gradient that is higher in doping concentration toward the backside of the semiconductor; and
   a second shallow life-time control profile having a gradient that is heavier toward the top surface forming a shallow gradient band of decreasing concentration near the PN junction.

4. A fabrication process for making an enhanced avalanche ruggedness Fast Recovery Diode, comprising:
   selecting a semiconductor material of a first dopant type;
   introducing a preliminary dopant of a first type prior to a step of patterning and introducing a first dopant of a second type to prevent current flow along a surface of the semiconductor material between an active area and an edge of the device across the field-spreading structures;
   diffusing said first dopant to create field spreading structures for blocking reverse voltage;
   introducing a second dopant of the first type into a central portion of the semiconductor material top surface;
   diffusing said second dopant to create a region with enhanced doping concentration of the first type within the semiconductor material in the central portion of the device;
   introducing and diffusing a third dopant of the second type to a predetermined depth within said enhanced doping region to form a main PN junction and effect a lower avalanche breakdown in the central portion in relationship to a periphery of the main PN junction; and
   completing the device by forming metal electrodes on the top surface and a backside of the semiconductor material to conduct current through the diode.

5. A fabrication process according to any of claims 1, 2, and 4 wherein the concentration of the second dopant of the first type is in the range of 1.0E15 to 5.0E17/cm3 and a diffusion depth of 3 to 10 um.

6. A fabrication process according to any of claims 1, 2, and 4 wherein the concentration of the third dopant of the second type is in the range of 1.0E16 to 5.0E18/cm3 and a diffusion depth of 2 to 6 um.

7. A fabrication process according to any of claims 1, 2, and 4 wherein an amount of additional charge contained between the second dopant of the first type and a starting epitaxial layer is in the range of 1.0E11 to 1.0E13/cm2.

8. A fabrication process according to any of claims 1, 2, and 4 including introducing and diffusing life-time control dopant into the semiconductor to control device speed.

9. The fabrication process according to any of claims 1, 2 and 4 in which the semiconductor material comprises a lightly doped epitaxial layer on top of a heavily doped substrate.

10. A fabrication process according to any of claims 1, 2, and 4 wherein the PN junction is formed by a body diffusion of a MOS gate-controlled device.

11. A fabrication process according to any of claims 1, 2, and 4 wherein the PN junction is a deeply placed P+ diffusion underneath a body diffusion in a MOS gate-controlled device.

12. A fabrication process according to any of claims 1, 2, and 4 including irradiating the semiconductor to effect a life-time control to control device speed.

13. A fabrication process for making a Fast Recovery Diode, the process comprising:

selecting a semiconductor material of a first dopant type;

patterning and introducing dopant of a second type opposite in polarity to the first dopant type into the top surface of the semiconductor material;

diffusing said dopant of a second type to create field spreading structures for blocking reverse voltage and to form a main PN junction in the central active portion of the device;

forming metal electrodes on the top surface and a backside of the semiconductor material to conduct current through the diode;

further comprising a blanket implant of a dopant of the first dopant type into the semiconductor surface to counter the effect of counter-doping and compensation by a life-time control dopant.

14. A fabrication process for making a Fast Recovery Diode, comprising:

selecting a semiconductor material of a first dopant type;

introducing a preliminary dopant of the first type prior to a step of patterning and introducing a first dopant of a second type opposite in polarity to the first dopant type to prevent current flow along a surface of the semiconductor material between an active area and an edge of the device across the field-spreading structures;

diffusing said first dopant to create field spreading structures for blocking reverse voltage;

patterning and introducing dopant of a second type opposite in polarity to the first dopant type into the top surface of the semiconductor material;

diffusing said dopant of a second type to create field spreading structures for blocking reverse voltage and to form a main PN junction in the central active portion of the device; and completing the device by forming metal electrodes on the top surface and a backside of the semiconductor material to conduct current through the diode.

15. The fabrication process according to claim 13 or 14 further comprising a first deep life-time control dopant profile having a gradient that is higher in doping concentration toward the backside of the semiconductor; and a second shallow life-time control profile having a gradient that is heavier toward the top surface forming a shallow gradient band of decreasing concentration near the PN junction.

* * * * *